United States Patent
Hente

(10) Patent No.: US 10,165,649 B2
(45) Date of Patent: Dec. 25, 2018

(54) LED DEVICE, LED DRIVER, AND DRIVING METHOD

(71) Applicant: OLEDWorks GmbH, Aachen (DE)

(72) Inventor: Dirk Hente, Wurselen (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 15/554,323

(22) PCT Filed: Mar. 30, 2016

(86) PCT No.: PCT/EP2016/056884
§ 371 (c)(1),
(2) Date: Aug. 29, 2017

(87) PCT Pub. No.: WO2016/156373
PCT Pub. Date: Oct. 6, 2016

(65) Prior Publication Data
US 2018/0242425 A1 Aug. 23, 2018

(30) Foreign Application Priority Data
Mar. 30, 2015 (EP) ................... 15161668.7

(51) Int. Cl.
*H05B 37/02* (2006.01)
*H05B 33/08* (2006.01)
*H01L 51/52* (2006.01)
*G01R 27/26* (2006.01)
*H01L 49/02* (2006.01)

(52) U.S. Cl.
CPC ..... *H05B 33/0896* (2013.01); *G01R 27/2605* (2013.01); *H01L 51/529* (2013.01); *H01L 51/5253* (2013.01); *H01L 28/60* (2013.01)

(58) Field of Classification Search
CPC .............. H05B 33/0896; H01L 51/529; H01L 51/5253; H01L 28/60; G01R 27/2605
USPC ......................................................... 315/307
See application file for complete search history.

(56) References Cited

U.S. PATENT DOCUMENTS

| | | | |
|---|---|---|---|
| 2007/0029939 A1* | 2/2007 | Burkum | G09F 13/22 315/86 |
| 2011/0169494 A1 | 7/2011 | Zudrell-Koch et al. | |
| 2011/0187285 A1* | 8/2011 | Hente | H05B 33/0896 315/294 |
| 2013/0082997 A1 | 4/2013 | Wurzel et al. | |
| 2015/0014648 A1 | 1/2015 | An | |

(Continued)

FOREIGN PATENT DOCUMENTS

| DE | 102013109814 A1 | 3/2015 |
|---|---|---|
| EP | 1941484 | 4/2007 |

(Continued)

OTHER PUBLICATIONS

European Patent Office, European Search Report, dated Nov. 3, 2015, 2 pages.

(Continued)

*Primary Examiner* — Don Le

(57) ABSTRACT

An LED device comprises a substrate and a stack of layers defining an LED component and including an electroluminescent layer. A capacitive structure is formed on top of the stack of layers. The area of the defined capacitor encodes information concerning the electrical characteristics of the LED component.

14 Claims, 8 Drawing Sheets

(56) References Cited

U.S. PATENT DOCUMENTS

| | | | | |
|---|---|---|---|---|
| 2015/0049056 A1* | 2/2015 | Post | ............... | G06F 3/046 345/174 |
| 2015/0264045 A1* | 9/2015 | Blondeau | ............... | G06F 21/31 726/5 |
| 2016/0211476 A1 | 7/2016 | Ingle et al. | | |
| 2016/0302266 A1* | 10/2016 | Marent | ............... | H05B 33/083 |
| 2017/0019974 A1* | 1/2017 | Rickers | ............... | H05B 33/0848 |
| 2017/0110905 A1* | 4/2017 | Simmet | ............... | H05B 33/0842 |

FOREIGN PATENT DOCUMENTS

| | | |
|---|---|---|
| EP | 3076757 A1 | 3/2015 |
| WO | 02/019775 A2 | 3/2002 |
| WO | 2007046030 A2 | 4/2007 |
| WO | 2008120143 A2 | 10/2008 |
| WO | 2009057041 A1 | 5/2009 |
| WO | 2010029459 A1 | 3/2010 |
| WO | 2010034509 A2 | 4/2010 |
| WO | 2010125493 A1 | 11/2010 |
| WO | 2013114244 A1 | 8/2013 |
| WO | 2013132401 A1 | 9/2013 |
| WO | 2016156375 A1 | 10/2016 |

OTHER PUBLICATIONS

European Patent Office, European Written Opinion, 5 pages.
International Preliminary Examining Authority Patent Cooperation Treaty, Notification of Transmittal of the International Preliminary Report on Patentability and International Preliminary Report on Patentability, dated Jun. 1, 2017, 11 pages.

* cited by examiner

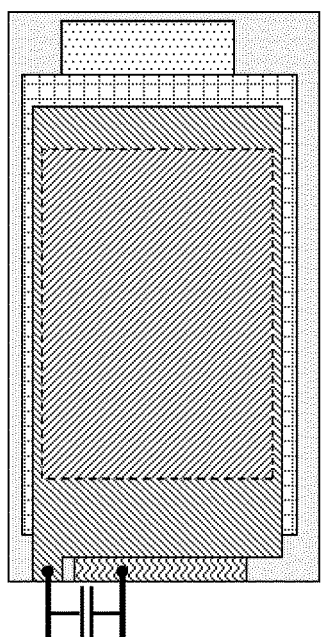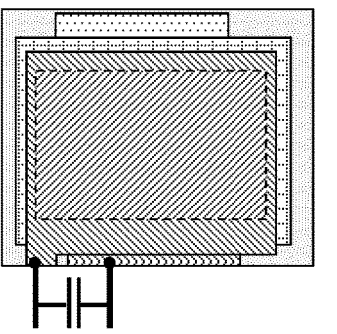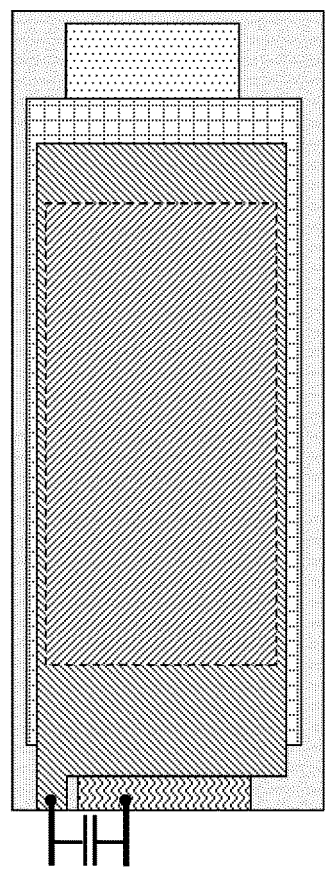
FIG. 6

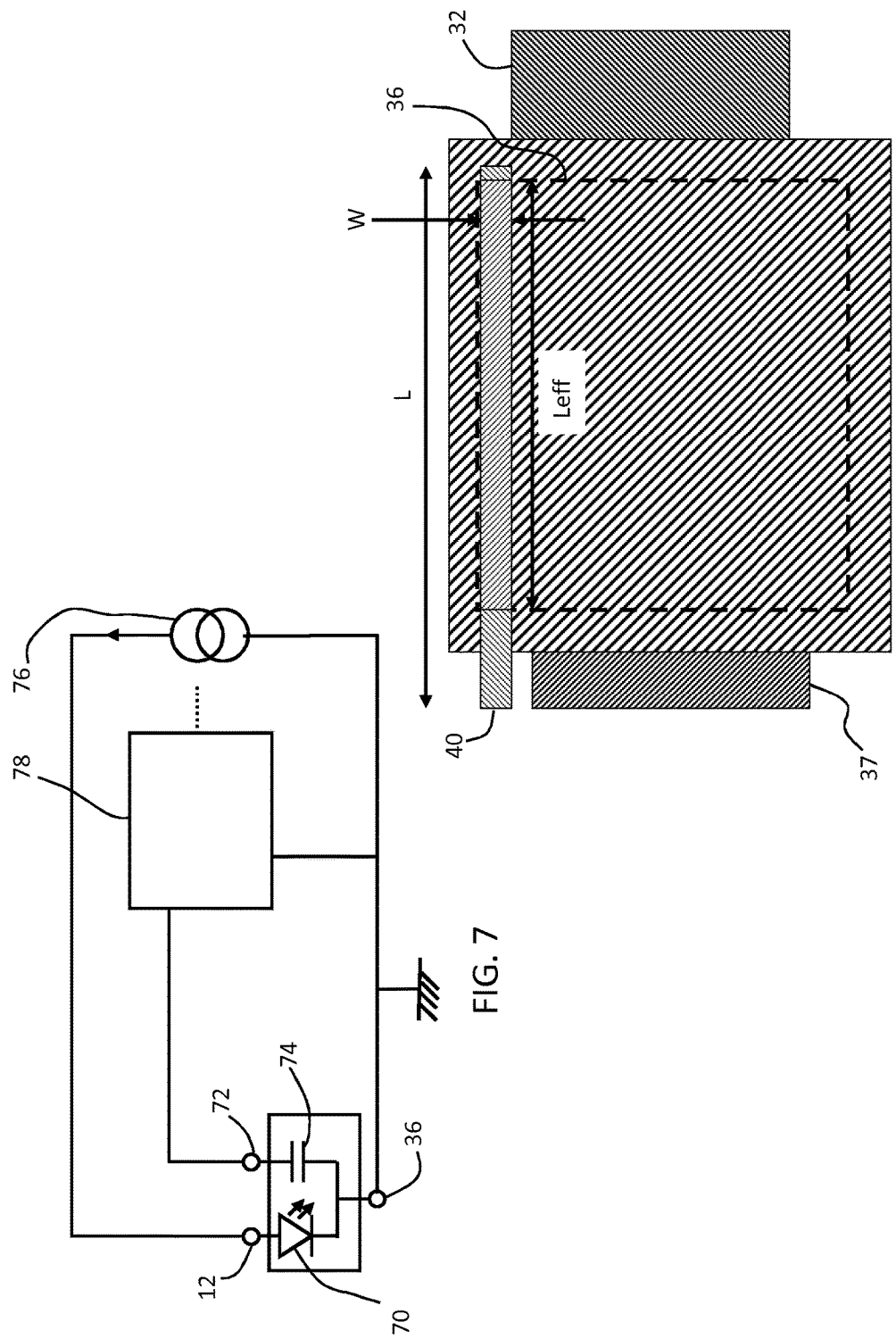

LED DEVICE, LED DRIVER, AND DRIVING METHOD

FIELD OF THE INVENTION

This invention relates to LEDs which encode information about their electrical characteristics, which may be taken into account when driving the LED.

BACKGROUND OF THE INVENTION

It is known that it is desirable for an LED driver to be able to recognize the type of LED to which it is connected, and that an LED device can be arranged to provide information about its characteristics to enable a driver to be controlled accordingly.

In this description and claims, the general term "LED" will be used. The detailed examples below are based on OLEDs as the invention relates to device with a light emitting layer which extends over an area.

LEDs are current driven lighting units. They are driven using an LED driver which delivers a desired current to the LED.

The required current to be supplied varies for different lighting units, and for different configurations of lighting unit. The latest LED drivers are designed to have sufficient flexibility that they can be used for a wide range of different lighting units, and for a range of numbers of lighting units.

To enable this flexibility, it is known for the driver to operate within a so-called "operating window". An operating window defines a relationship between the output voltage and output current that can be delivered by the driver. Providing the requirements of a particular lighting load fall within this operating window, the driver is able to be configured for use with that particular lighting load, giving the desired driver flexibility.

The driver has its output current set to the desired level within its operating window.

Different types of LED (with different shape, color, size, organics or brightness) require different electrical driving parameters such as current and voltage. Several proposals have been made to encode the type of the LED into its structure, which can be read out using dedicated detector terminals (either wired sockets or capacitively coupled pads). This enables the driver to be programmed to deliver a specific current.

A much simpler way is to use resistors (or other components) to encode the type of the OLED or the required driving current. In this way, a current setting resistor or other component, outside the driver, is read by the driver. The value of the current setting resistor or other component is measured by the driver, which can then configure its output accordingly, so that the output current is determined by the resistance value. The important point is that after the driver has been produced, the output current can be selected, so that a single driver design is suitable for a range of output currents.

Once the current has been set, the voltage delivered by the driver will vary depending on the load presented to it (since the LEDs are current driven), but the driver will maintain this voltage within the operating window.

There is a particular need for a flexible driver because OLED technology is quite new and developing fast. Times between innovation of new materials and OLED architectures to give improved performance data (lumen, brightness, efficiency, size, . . . ) are very short, for example compared to typical support periods for products using the OLEDs. This support period is typically in the range of multiple years. Driver electronics also develops quickly to keep up with the demands of the new devices, particularly as driver architectures from historical LED technology cannot be simply copied to support OLEDs as well.

Although lifetime and reliability of OLEDs is also continuously improving, failed products have to be replaced. The required performance of typical devices requires the implementation of multiple OLEDs per luminaire. There is a need to be able to exchange just one OLED within such a device, and to then use an updated OLED design. For example, it is desired not to produce old device architectures longer than required, so that all production time can be allocated to state of the art devices.

One way to support older OLEDs with newer drivers or drive newer OLEDs in applications equipped also with older devices is to provide a flexible driver which knows how to drive the OLED appropriately (reduced current, dedicated dimming levels, and any other OLED characteristics and settings) and this is enabled by the current setting resistor (or other component such as a capacitor) as mentioned above. These components can be provided on a PCB attached to the OLED.

A drawback of this approach is that everything added to the back of the OLED contributes to the overall thickness of the luminaire/module. It also requires additional pick and place steps as well as solder steps to apply the resistor (or any other component) to a PCB.

In addition to that, to be able to encode a certain range of different currents, e.g. 100 mA . . . 2 A, a certain variety of resistors has to be on stock and chosen accordingly.

There is therefore a need for a way to encode OLED information directly into the device structure.

It is known that the internal capacitance of an OLED device is indicative of its area for a fixed stack architecture. The intrinsic capacitance appears, however, across the driving terminals of an OLED device. The detection of this capacitance is a challenging task, because it is affected by the OLED driving circuitry. Especially, the fact that typical power supplies include a filter capacitor across their terminals makes it nearly impossible to detect the intrinsic OLED capacitance accurately.

WO 2010/029459 discloses the use of a tag element to encode operating information about an OLED device. The tag may be a barcode, or it may be an electrode which has an area which encodes the operating information, based on a capacitance being dependent on the electrode area. This requires a specific design of the tag element.

SUMMARY OF THE INVENTION

The invention is defined by the claims.

According to the invention, there is provided an LED device, comprising:
 a substrate;
 a stack of layers defining an LED component, which layers include an electroluminescent layer, a top electrode layer, and an encapsulation layer over the top electrode layer;
 a capacitor electrode layer formed on top of the stack defining a capacitor electrode, thereby to define a capacitance between the capacitor electrode and the top electrode layer of the stack of layers, with the encapsulation layer defining the capacitor dielectric layer, wherein the capacitor electrode has an area which is a predetermined ratio of the LED light output area.

This device is able to encode relevant data concerning the electrical characteristics of the LED component using existing layers of the LED component structure. By using a capacitor area to encode the LED electrical characteristics, the same design can simply be scaled to encode different information for different devices. In particular, the drive current required by an LED may scale with area so that a correspondingly scaled capacitor area automatically encodes a suitably scaled LED drive current requirement.

By using a layer over the stack, no additional required area may be needed.

The area of the capacitor electrode layer can be determined by measurement of the capacitance (between contact electrodes). The capacitor electrode is be formed over the stack of layers of the LED component, thereby taking up no further lateral space around the LED component, and it can also be implemented with very thin layers.

The existing encapsulation layer forms the capacitor dielectric layer. In this way, one additional layer is needed to a conventional LED stack, and this can be a thin metal (or other conductive) layer.

A set of LED devices of this type may be provided, wherein each LED device has a different size electroluminescent layer, and wherein the area of the capacitor electrode layer of each LED device has the same proportion to the area of the electroluminescent layer.

In a first example, the area of a single capacitor electrode encodes information concerning the electrical characteristics of the LED component.

In a second example, the capacitor electrode layer defines a reference capacitor electrode and a readout capacitor electrode, thereby to define a reference capacitance and a readout capacitance between the capacitor electrodes and the top electrode layer of the stack of layers, wherein the relative areas of the reference and readout capacitor electrodes encodes information concerning the electrical characteristics of the LED component.

The reference capacitor defined by the reference electrode can be used to calibrate the capacitance measurement using the readout electrode. For example, the reference electrode may have the same area for different sized LED devices, and the measurement is then a capacitance ratio measurement with respect to a fixed area reference portion. This enables compensation for variations in the thickness and material of the encapsulation layer which forms the capacitor dielectric. The relative capacitance is directly related to the area of the readout capacitor.

In both cases, the encoded information may relate to a desired driving current and/or voltage and/or a required dimming level and/or color point.

The capacitor electrode layer may comprise a heat spreading layer, wherein the encapsulation layer in combination with a heat spreading adhesive layer define the capacitor dielectric. A heat spreading layer may already be required by the LED device design and in this case the capacitor can be defined without requiring any additional layers or area.

The device may instead further comprise a heat spreading layer over the capacitor electrode layer. The two layers may then be optimized for their respective functions.

The invention also provides an LED lighting apparatus comprising:

a device defined above and which comprises a PCB which connects to the terminals of the LED component; and a driver comprising a connection part for interfacing with the PCB, wherein the driver comprises testing circuitry for determining a capacitance or relative capacitance, which is dependent on the Led light output area.

The testing circuitry is thus part of the driver, so that the components which need to be carried by the PCB are kept to a minimum. The PCB acts as an interface between the driver and the substrate of the device. The PCB may carry no components at all and simply function as an interface.

The driver may then be adapted to drive the LED device in dependence on the information concerning the characteristics of the LED component as determined by the testing circuitry.

The invention also provides a method of driving an LED device which comprises a substrate, a stack of layers defining an LED component, which layers include an electroluminescent layer, a top electrode layer, and an encapsulation layer over the top electrode layer and a capacitor structure, the method comprising:

measuring a capacitance ratio between a first capacitor and a second capacitor, of the capacitor structure, wherein the capacitance ratio is proportional to the LED light output area; and driving the LED device using a driver which is controlled in dependence on the encoded information.

This method uses a relative capacitance measurement to enable the area of a capacitor to encode information, and in a way which tolerates differences in capacitor dielectric properties.

The capacitance may be measured of the first and second capacitors in sequence, and the capacitance ratio is then subsequently derived. Alternatively, the capacitance ratio may be measured directly.

The first capacitor may have an area which is proportional to the LED light output area, and the second capacitor may have an area which is fixed as between LED devices of different size of LED light output area.

BRIEF DESCRIPTION OF THE DRAWINGS

Examples of the invention will now be described in detail with reference to the accompanying drawings, in which:

FIG. 6 shows how the design is scaled to different sizes;

FIG. 7 shows a first example of circuit for measuring the capacitance;

FIG. 8 shows a variant of the first example of electrode layout which may be used;

DETAILED DESCRIPTION OF THE EMBODIMENTS

The invention provides an LED device, comprising a substrate and a stack of layers defining an LED component and including an electroluminescent layer. A capacitive structure is formed on top of the stack of layers. The area of the defined capacitor encodes information concerning the electrical characteristics of the LED component.

The encoded information can be electrical information such as driving voltage and/or current and dimming levels. These may correspond directly to the area of the LED device, so that the encoding layer naturally encodes this information by making it scale with the size of the LED component. However, other information such as size, shape, color point, single or tunable LED etc. can also be encoded.

A PCB can be used to interface between the device and a driver. The PCB may already be a required part of the device design, for example a PCB may already be present as part of an LED device design for improved current distribution on substrates with limited conductivity.

Figure 1:
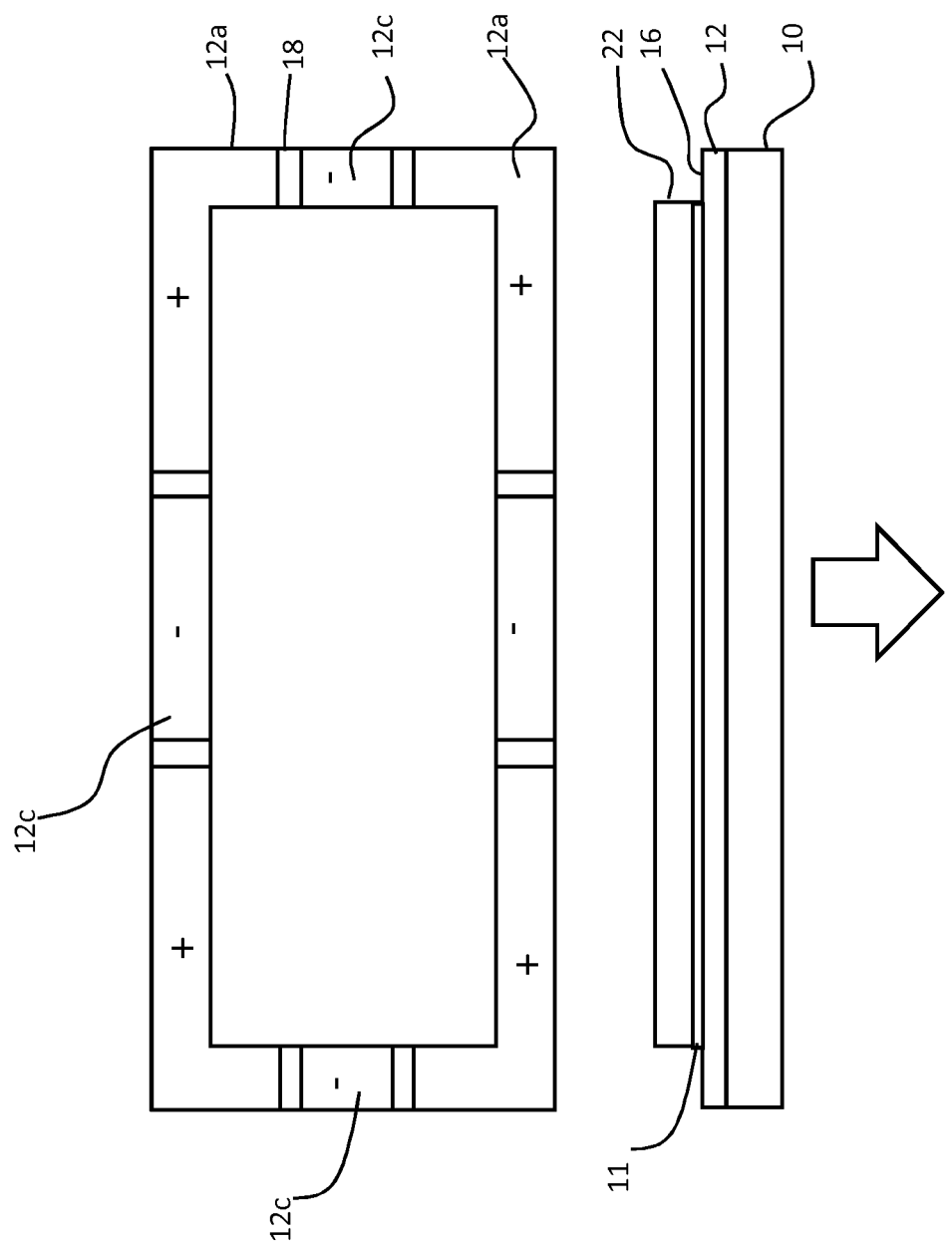
FIG. 1 shows an example of an OLED device.

FIG. 1 shows in simplified schematic form an example of OLED device to which the invention can be applied.

The OLED comprises a substrate 10 and a transparent conductive layer 12 over the substrate (transparent because this example is a bottom emitting structure). An encapsulated OLED structure is provided over the contact layer 12, comprising OLED layers 11 which are much thinner than the substrate, and an encapsulation 22. An outer ledge 16 of the contact layer 12 extends laterally beyond an outer edge of the encapsulated OLED structure.

The OLED structure has multiple anode and cathode contacts, and these connect to different contact regions of the contact layer 12 in the ledge area to form contact areas for the cathode and anode layers of the OLED structure. The plan view in FIG. 1 shows four cathode contact regions 12c, one at the center of each edge of the OLED structure, and four anode contact regions 12a at the four corners. Separation gaps 18 are provided.

FIG. 1 shows a bottom emitting OLED structure, with light emitted through the substrate. For this reason, the contact layer 12 is transparent, and can for example comprise ITO, ZnO:Al, or other transparent conductors, typically materials from the group of transparent conductive oxides (TCOs). New technologies such as carbon nanotubes or layer sequences can also be used. The relatively high resistance of some transparent conductors, such as ITO, means that electrical connections with better conductivity are desired to distribute the current along the contact ledges to the anode contact regions and the cathode contact regions to reduce voltage drop and hence improve on homogeneity.

For this purpose, a PCB in a frame shape can be mounted over the contact ledge 16. The structure is shown in more detail in FIG. 2, with the PCB 20 mounted on the contact ledge 16.

Other approaches for forming contacts and to improve lateral current injection are available such as a bonded anisotropic conductive film ("ACF") or glued metal wires. These present a simpler and cheaper alternative to a PCB.

The structure of the OLED device can be conventional. A typical OLED according to the state of the art consists of active organic layers, a cathode, an anode, and a substrate. The active organic layers consist of a hole transport layer and a light emitting polymer for a polymer-based OLED (known as p-OLEDs). The small-molecule version of an OLED (known as sm-OLEDs) consists of some additional layers: hole injecting, emitting, hole blocking and electron transport layers. Furthermore functional layers like CGL (charge generation layers) can also be included. The manufacture of the OLED can be based on printed or evaporated OLEDs but also other/future techniques like liquid processing can be used.

In the context of this invention it is sufficient to reduce the complex internal structure of a real OLED device, shown simply as layer 11 in FIG. 1, to a simplified three layer arrangement of the anode layer, the active emission layer and the cathode layer.

Furthermore, additional encapsulation thin film layers 22 are deposited on this stack, as mentioned above, to protect the organic material from e.g. water and oxygen to prevent early degradation of the OLED materials. This protection is called thin film encapsulation (TFE), because the layer or layers have a thickness of about 100 nm. The thin film encapsulation layer can consist of inorganic oxides, such as $Al_2O_3$ or alternating layers of of $Al_2O_3$ and $ZrO_2$, called a nanolaminate structure, deposited for example by atomic layer deposition (ALD).

Also other materials such as other oxides or nitrides can be used. These encapsulation thin film layers are dielectric and insulating.

The OLED active layers are deposited on a substrate which may be coated with, for instance, indium tin oxide (ITO), thereby forming an ITO layer typically of about 150 nm to function as a hole-injecting electrode. The cathode applied on top of the organic layers which provides electron injection is of the order of 100 nm thick.

The OLED layer stack 11 is provided between the anode layer 12 and the encapsulation 22.

The contact layer 12 may itself function as the anode, and the layer stack 11 then comprises the organic layers and a top cathode metal. Alternatively, the layer stack 11 may include the anode layer (in addition to the contact layer).

The substrate 10 is the substrate for the OLED stack. The substrate can be glass for rigid devices or it may be plastic (typically with a barrier layer) for example for flexible devices. Very thin glass substrates can also enable a degree of bending.

In the example shown, the encapsulation 22 overlaps the edge of the OLED layers 11 but terminates before the contact ledge 16, whereas the contact layer 12 extends fully to the outer edge so that the PCB 20 can connect to the contact regions.

An alternative is to extend the encapsulation layers (in case of thin film encapsulation rather than glass encapsulation) to the edge of the device which is then locally removed in regions where contact with the underlying electrodes is desired.

The cathode layer can be sufficiently conductive to provide homogeneous devices of relevant dimensions. However, a metal foil 14 may also be provided over the top for heat distribution/dissipation and mechanical protection of the thin film encapsulation. An adhesive layer 15 bonds the metal foil (if present) to the encapsulation 22.

As one example only, the ledge width can be of the order of 3 mm, the overall device thickness can be approximately 1 mm to 3 mm based on a rigid glass substrate thickness typically in the range 0.7 to 2.0 mm. Thinner devices may be formed using bendable glass substrates or flexible plastics substrates. The overall panel size can have typical linear dimensions in the range 5 cm to 30 cm, although larger or smaller devices are possible.

The PCB 20 is glued to the OLED and hence is part of the module which is generally sold separately from the driver electronics. The PCB is not removable from the device substrate. The driver electronics is then wired to the PCB.

Figure 2:
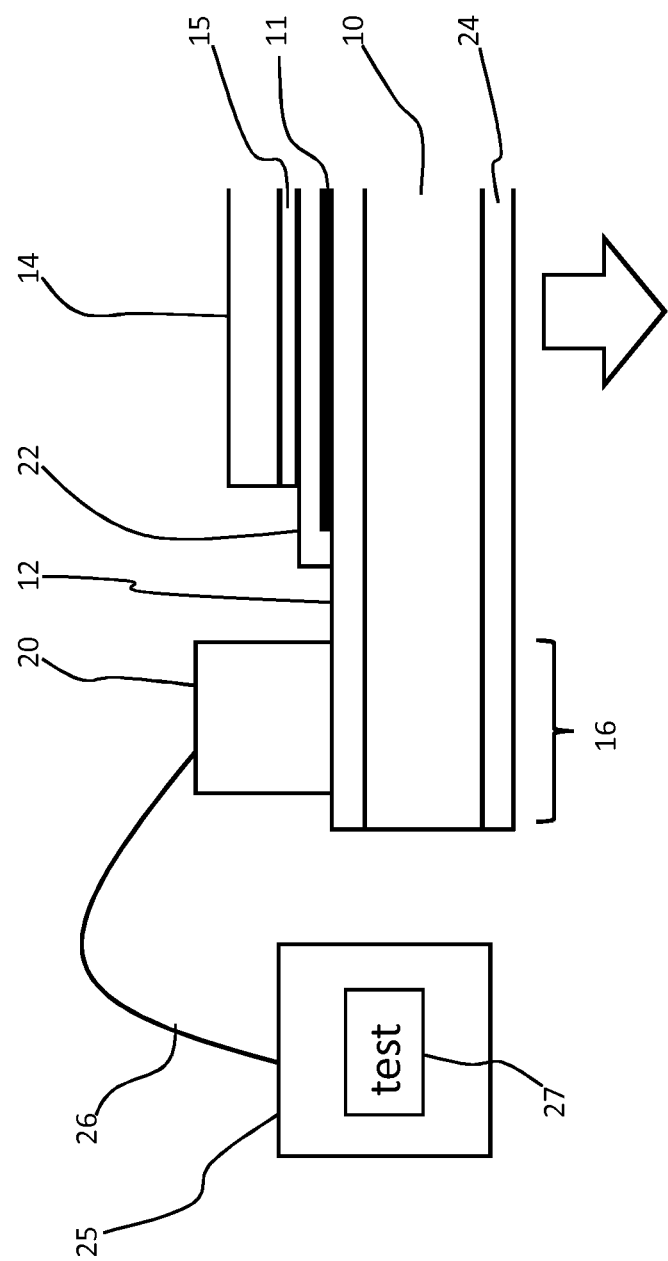
FIG. 2 shows how a PCB can be mounted on the OLED device ledge.

FIG. 2 shows schematically the driver 25 coupled to the PCB 20 by a flat cable 26, although a plug and socket can be used. This interconnection between the LED-PCB module and the driver can be located at a different place to the OLED unit itself, for example set aside in a luminaire housing or in a piece of furniture.

The driver 25 includes testing circuitry 27, described further below. The combination of driver 25 and OLED module may change throughout the lifetime of an OLED, whereas the combination of an OLED and its associated PCB will not.

The printed circuit board 20 has a bottom metallization layer which includes pads for connecting to the anode and cathode regions 12a, 12c. Conductive glue can be used to bond these pads to the cathode and anode contact regions of the connection layer. The PCB has a second metallization layer for providing interconnects between the anode regions and between the cathode regions. It might comprise even more layers in case more complex contacting structures are used, for example as may be required for color tunable devices. Thus, the PCB comprises at least two conducting layers. Vias are used to connect between the layers at desired locations.

The second layer can be at the top or within the PCB structure.

In one example, the PCB has a frame shape mounted over the outer ledge 16. In addition to interconnecting the cathode and anode regions, it provides the external contacts for electrical connection of the driver to the OLED as shown in FIG. 2. Other shapes of the PCB can be used, or a number of smaller more local PCBs can be used to contact the cathode/anode layers if the device design allows for it.

FIG. 2 also shows a light diffusing foil 24 at the light output face of the OLED package. This may or may not be desired depending on the lighting application.

The invention makes use of a capacitive encoding structure formed within, or on top of, the stack of layers which define the OLED.

The capacitor arrangement makes use of existing layers within the structure of the OLED. For example, the capacitor arrangement may make use of the thin film encapsulation 22, for example deposited on the cathode side of the OLED. The anode side is then protected by the carrier material directly in the case of a glass substrate or via further layers in the case of a plastic substrate.

The addition of a capacitor electrode, for example as part of an extended thin film encapsulation, implements a dedicated integrated capacitor structure to provide information about the size and type of the OLED device.

Figure 3:
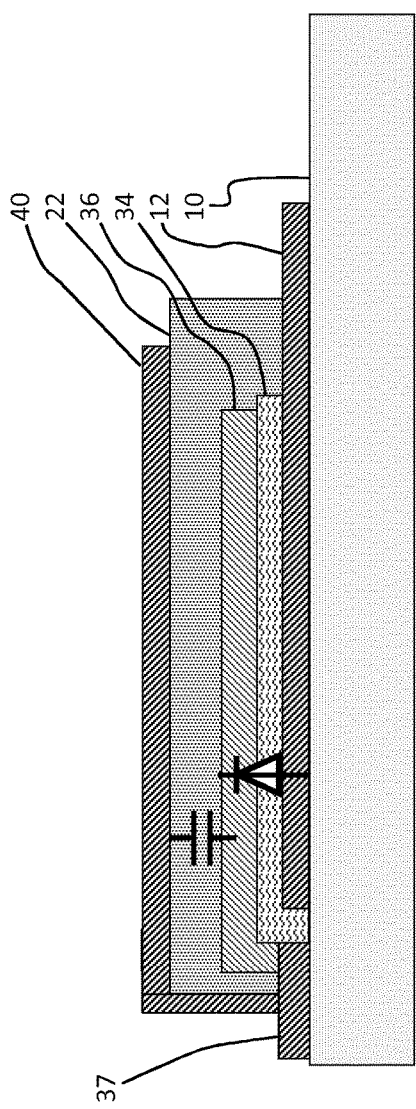
FIG. 3 shows a first example in which a capacitor electrode layer is used to encode electrical characteristic information about the OLED device.

FIG. 3 shows the structure used to form a capacitance. The OLED structure is shown as the active layer structure 34 and a top cathode 36. The contact layer 12 functions as the anode.

On top of the thin film encapsulation 22 there is a capacitor electrode layer 40. The encapsulation layer 22 typically has a thickness of about 100 nm. The capacitor electrode layer 40 may consist of any metal or transparent conducting oxide. The deposition process can be vacuum evaporation, sputtering, plasma enhanced laser deposition (PLD), or ALD. The cathode 36 couples down to a cathode contact portion 37 of the metal layer which forms the anode 12.

The capacitor electrode may be formed by the heat spreader 14 shown in FIG. 2 if it is an electrically conducting layer. This, in this case, the capacitor can be formed with no additional layers. The encapsulation layer 22 and the adhesive layer 15 then together function as the capacitor dielectric.

Thus, the layer 40 in FIG. 3 may be an additional metal layer over the encapsulation when there is no conductive heat spreader layer present, or else the layer 40 may comprise (or perform the additional function of) a heat spreader layer.

As a further alternative, an additional heat spreading layer may be provided over the top of the structure shown in FIG. 3. The use of separate heat spreading and capacitor electrode layers enables them to be optimized for their respective functions (i.e. thermal conductivity vs. electrical conductivity).

The conductive layer 40 forms a top capacitor electrode pad and defines the second electrode of a capacitor having its first electrode formed by the underlying cathode layer 36.

Figure 4:
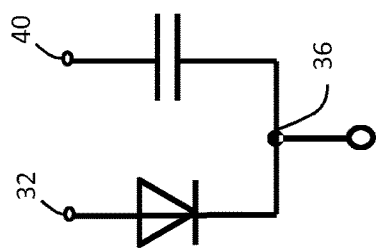
FIG. 4 shows how the capacitor and OLED are electrically connected in the structure of FIG. 3.

As shown in FIG. 4, the capacitor and OLED are in series between the anode contact 32 and the capacitor electrode 40.

The capacitor electrode 40 is formed so that it can be electrically contacted on the same side of the substrate as the anode and cathode areas 12,36 of the OLED device.

Figure 5:
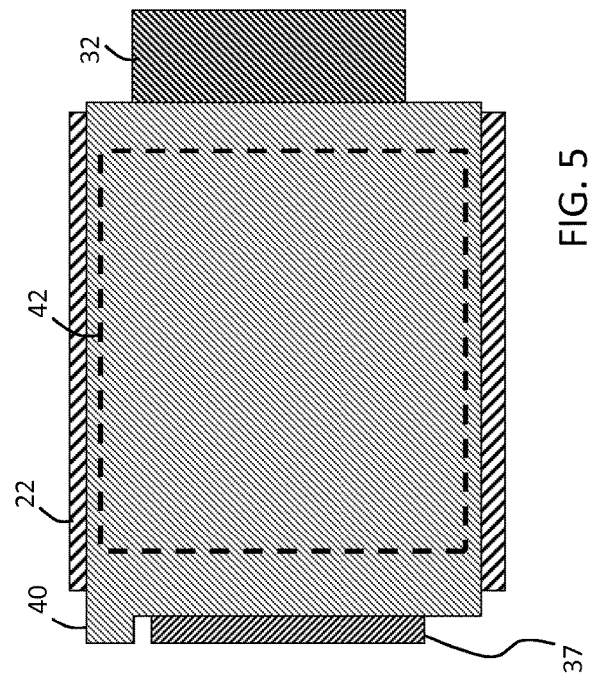
FIG. 5 shows a first example of electrode layout used in the example of FIG. 3.

As shown in the plan view of FIG. 5, the capacitor electrode 40 may be deposited over the complete OLED area (although leaving exposed contact areas for the anode and cathode 12,36). The effective area of the capacitor formed is shown by shape 42 which corresponds to the emission area. In this way, the capacitor has a capacitance which is proportional to the emission area $C=\varepsilon*Aeff/th$; where $\varepsilon$ denotes the effective permittivity of all dielectric layers located between the electrodes 36,40, "th" denotes the thickness of all dielectric layers and Aeff denotes the effective area, comprising the common area of the two electrodes and dielectric layers.

The capacitive value C is indicative of the area of the OLED device. This is schematically indicated in FIG. 6 for various OLED sizes. Each of the three examples is based on the structure of FIG. 5, but scaled to a different size and shape.

Assuming a constant current density Sd resulting in a constant OLED brightness the driving current can be adjusted by making it dependent on the capacitive value C, i.e. $Id=ki*C$ (where ki is a proportionality constant).

A circuit arrangement to realize this automatic current adaption is shown in FIG. 7. This figure shows the OLED device 70 with anode and cathode terminals 12, 36 and an additional terminal 72 for the capacitive structure 74. A power supply 76 is coupled to the OLED device via the terminals 12,36. Additional circuitry 78 is coupled to the additional terminal 72. This additional circuit is used to determine the capacitive value of the structure 74 and generates an output signal which determines the operating current of power source fed into the OLED device.

The operating current for the OLED is determined according to a sequence as set out below:

In a first step, the power supply is coupled to the OLED. This assumes an initial state in which the OLED device is unpowered and the capacitive structure is discharged.

In a second step, the power supply is turned on which triggers the capacitance detector to determine the capacitance value of the capacitive structure 74 as a third step.

In a fourth step, the capacitance value is converted into a signal proportional to the capacitance.

In a fifth step, the current of the power source is adjusted depending on the signal proportional to the capacitance. The adjusted current is fed into the connected OLED device.

FIG. 8 shows an alternative in which the capacitor electrode layer 40 only covers a portion of the emission layer. The layer has a strip shape with length L and width W. The effective length Leff is the length which overlaps with the cathode area 36. By adjusting Leff and W the capacitance value can be made dependent on the type of OLED.

The examples above are used to explain how a capacitance may be formed as an integrated part of the the OLED stack and how its capacitance may be read out.

One possible drawback associated with the measurement of the capacitance is that this capacitance value will vary in dependence on the nature of the encapsulation layer, in particular the thickness of the layer. This thickness may vary between different OLED designs. For example if a design is scaled up in size, the encapsulation may be scaled in thickness as well as in overall area. These differences in the nature of the encapsulation can be taken into account by the driver, by providing additional information to the driver concerning the nature of the encapsulation used in the particular OLED design.

An alternative approach is to make use of an additional reference capacitor of fixed size. For this purpose, a pair of capacitor electrodes may be used. One electrode defines a readout capacitor and another electrode defines a reference capacitor. The reference capacitor has a fixed size, whereas the readout capacitor scales with the OLED design. The relative area of the reference and readout capacitor is used to encodes information concerning the electrical characteristics of the LED component.

As an example, 1 cm$^2$ of the OLED area may be used as the reference capacitor, and a fixed proportion (90% or 50% for example) of the remaining area is used to for the readout capacitor. In this way, one of the capacitors scales if the design is scaled, whereas the other stays a constant size. The ratio of the areas between the two capacitors is then used to encode the required driver current.

Thus, instead of using an absolute value of capacitance as an indication for the forward current, the ratio between the capacitance values associated with the electrodes 90a and 90b is used.

Figure 9:
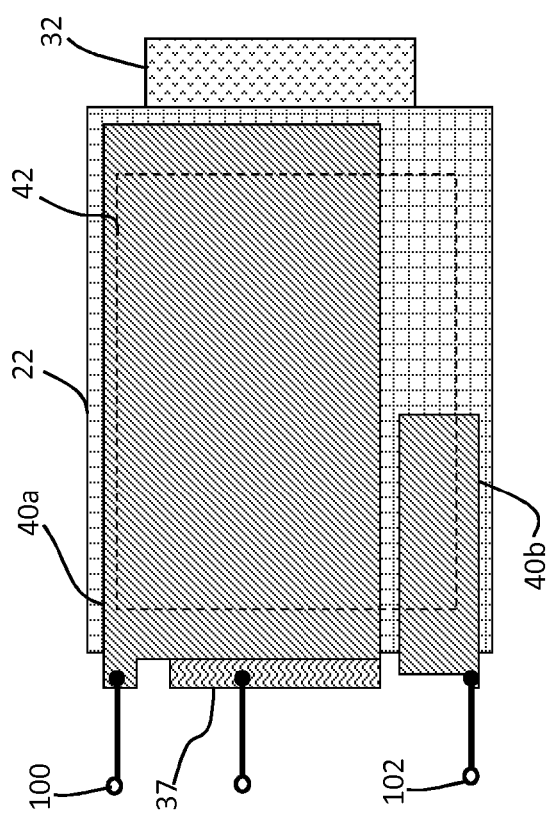
FIG. 9 shows how two capacitor electrodes may be defined in a similar structure to that shown in FIG. 5.

This requires a modification to the structure, as shown in FIG. 9.

The capacitor electrode is formed as two portions comprising a variable size portion 40a which has an area which is a fixed proportion of the area of the OLED stack and a fixed size portion 40b. Each has its own respective readout terminal 100, 102.

The capacitive structure is now divided into two parts. Two capacitors are defined in parallel, formed by separating he capacitor layer into two the portions 40a, 40b. The area 40a is proportion to the active area 42 of the OLED while the area 40b is constant.

The two capacitors define capacitance values $Ca=Aa/(eps*th)$ and $Cb=Ab/(eps*th)$, where Aa and Ab are the areas of electrodes 40a and 40b, and Ca and Cb are the resulting capacitances.

The capacitance ratio rC is given by:

$$rC=Ca/Cb=Aa/Ab.$$

The area Aa is proportional to the emission area whereas Ab is constant, so that the ratio rC is proportional to the emission area. This ratio can thus be used to adjust the driving current for example to achieve a constant brightness for a range of OLED devices having different areas.

Figure 10:
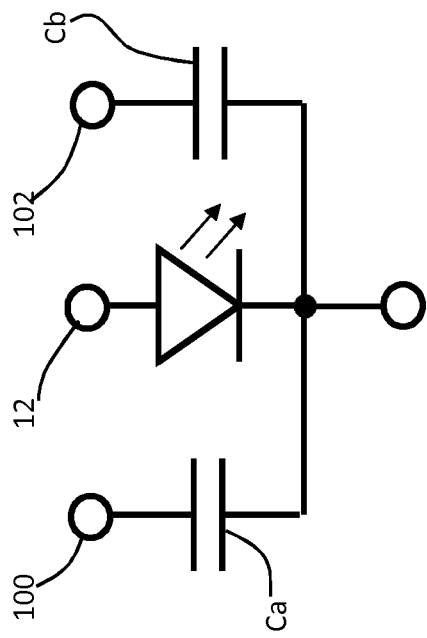
FIG. 10 shows how both capacitors and the OLED are electrically connected in the structure of FIG. 9.

FIG. 10 shows the electrical circuit formed by the two capacitors, which are formed in parallel with the OLED.

Figure 11:
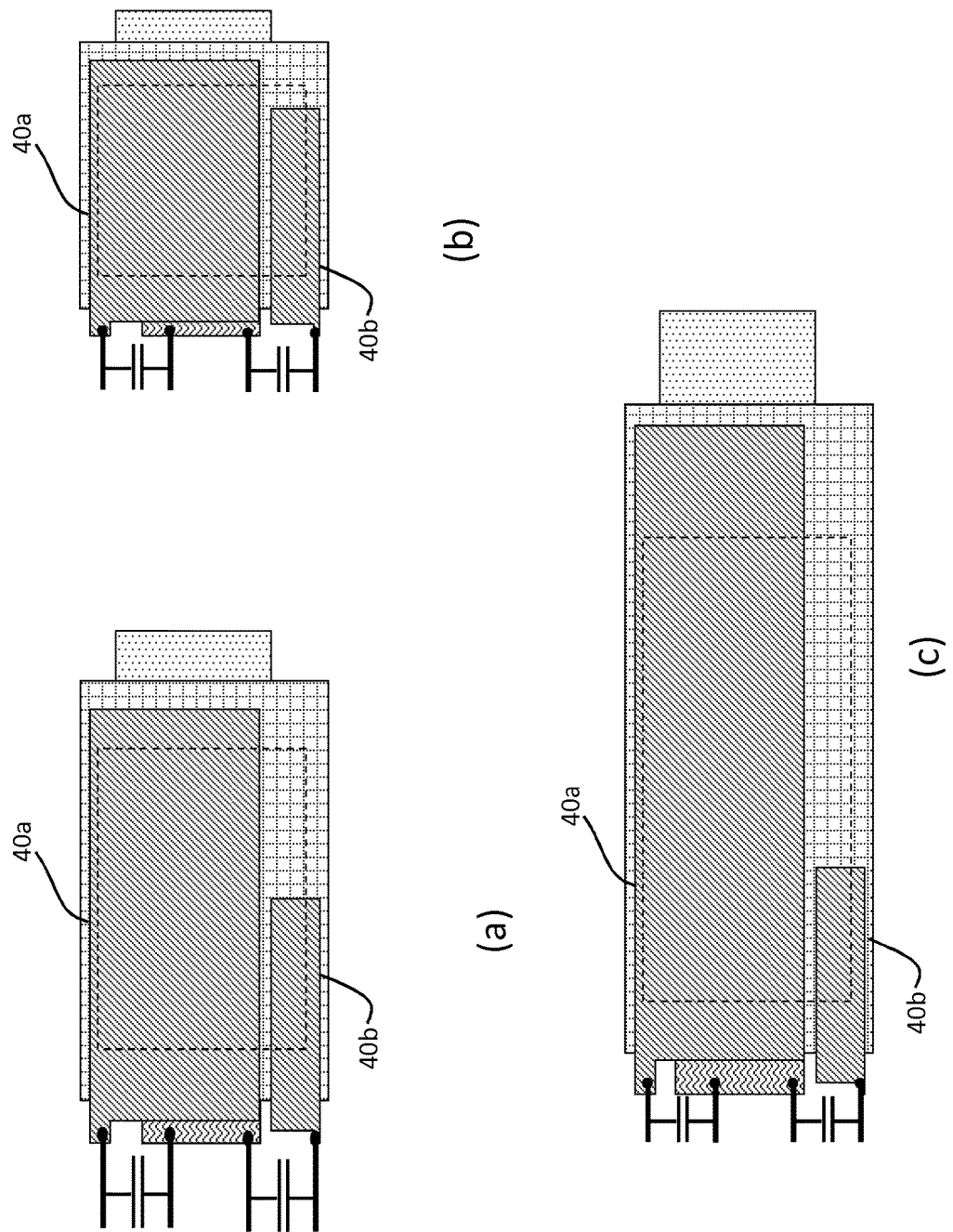
FIG. 11 shows how the design of FIG. 9 is scaled to different sizes.

FIG. 11 shows how the design of FIG. 9 is scaled to different OLED sizes. The electrode 40a scales whereas the electrode 40b does not. In fact, the size of the two portions of the electrode layer may be freely chosen as long as the required proportionality between the capacitance ratio and the emission area size is maintained for the whole range of differently sized OLEDs. Thus, it is not essential that the reference capacitor has a constant size for all OLED designs.

For example, a range of OLEDs of a certain design type may be designed with emission areas of 1.0, 1.5 . . . 9.5, 10 times a reference area $A_0$.

The smallest design may choose:

$$Aa=0.5A_0 \text{ and } Ab=0.1A_0.$$

The largest design may choose:

$$Aa=5A_0 \text{ and } Ab=0.1A_0.$$

The corresponding ratios are rC=5 and rC=50 for the smallest and largest OLED. These designs all have the same size reference area.

However, instead, the reference area may not be constant. For example, the smallest design may choose:

$$Aa=0.5A_0 \text{ and } Ab=0.1A_0.$$

The largest design may choose:

$$Aa=2.5A_0 \text{ and } Ab=0.05A_0.$$

The corresponding ratios are again rC=5 and rC=50 for the smallest and largest OLED but the reference area Ab is not constant. In this case, when a device becomes particularly large, the larger capacitor may reach a maximum size after which the reference electrode is reduced in size to achieve the desired ratio.

The advantage of the capacitance ratio approach is that the ratio is independent of the thickness th and permittivity eps, so that variations, for example due to production tolerances, are cancelled out.

The circuit arrangement has to be modified so that two capacitive values can be measured and a controlling signal has to be generated which is proportional to the ratio of the two capacitance values Ca and Cb. This can for example be achieved by using a basic capacitive detector and carrying out the measurements time-sequentially to determine both capacitive values.

Figure 12:
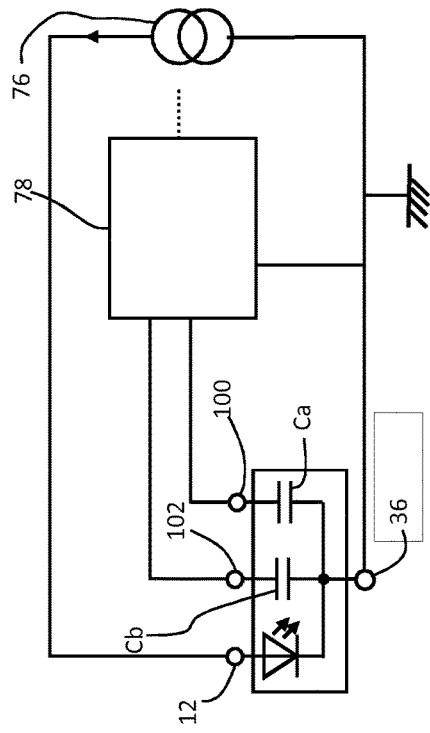
FIG. 12 shows a first example of circuit for measuring a capacitance ratio.

As shown in FIG. 12, this requires only a slight modification to the circuit of FIG. 7. The additional circuitry 78 is coupled to the two additional terminals 100, 102 in time sequential manner.

The operating current for the OLED is determined according to a sequence as set out below:

In a first step, the power supply is coupled to the OLED. This assumes an initial state in which the OLED device is unpowered and the capacitive structure is discharged.

In a second step, the power supply is turned on. This triggers the capacitance detector to determine the readout capacitance value Ca in a third step and to determine the reference capacitance Cb as fourth step.

In a fifth step, the circuit delivers a signal dependent on the ratio Ca/Cb.

In a sixth step, the current of the power source is adjusted depending on the signal dependent on the capacitance ratio. The adjusted current is fed into the connected OLED device.

Figure 13:
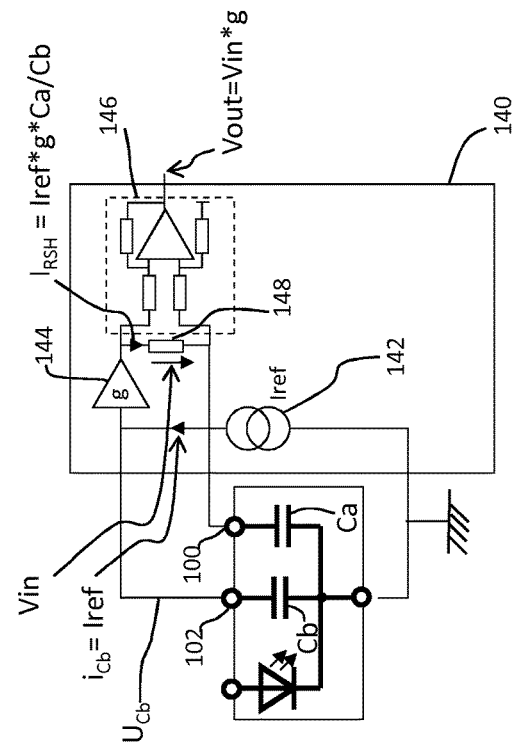
FIG. 13 shows a second example of circuit for measuring a capacitance ratio.

A detection circuit may instead be used which measures the capacitance ratio directly a shown in FIG. 13.

The readout circuit 140 comprises a current source 142 which drives a reference current Iref through the reference capacitor Cb. The resulting voltage is fed by a buffer 144 with gain g to one input of a differential measurement amplifier 146. The other input of the differential measurement amplifier is provided with the voltage on the readout capacitor Ca, and the difference between them is defined in FIG. 13 as Vin. This voltage is applied across a shunt resistor 148 with resistance RSH.

The capacitor current is given by $i_C = C*dU_C/dt$ for a capacitor voltage $U_C$, a capacitor current $i_C$, and a capacitance C.

Thus, $$i_{Cb} = Cb*dU_{Cb}/dt \quad (1)$$

$$i_{Ca} = Ca*dU_{Ca}/dt \quad (2)$$

The measurement amplifier 146 fixes the voltages at its inputs to be the same, namely:

$$U_{ca} = g*U_{Cb} \quad (3)$$

Combining these equations (substituting 3 into 1 and the result into 2) gives:

$$i_{Ca} = Ca/Cb*g*i_{Cb}$$

This is the same current that flows through the shunt resistor 148, Hence:

$$I_{Ca} = I_{RSH} \text{ and } V\text{in} = I_{RSH}*RSH = I_{Ca}*RSH.$$

$I_{Cb}$ is set by the circuit as Iref.

For example if the gain of the amplifier 146 is unity then Vout=Vin.

Thus $V\text{out} = RSH*Ca/Cb*g*I\text{ref}$

This output voltage Vout is the circuit output and is proportional to the capacitance ratio (and this remains the case if the amplifier 146 has a non-unity gain).

A set of devices of different sizes can be made to the same but scaled design. The scaling automatically alters the capacitance value as a result of the change in layer area. Again, the scaling does not alter the layer thicknesses, so it is in two dimensions.

The capacitance can be measured utilizing other circuits will will be well known to those skilled in the art.

The invention can be applied to all types of LED devices which generate output over an area of a layer, in particular OLED devices. It is of particular interest for general lighting applications and OLED based luminaires. For example the encoded information can relate to a light output panel with a single output area which has controllable brightness and/or color.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An LED device, comprising:
   a substrate;
   a transparent conductive layer on top of the substrate;
   a stack of layers on top of the transparent conductive layer defining an LED component, which layers comprise an electroluminescent layer, a top electrode layer, and an encapsulation layer over the top electrode layer;
   where the LED device further comprises a capacitive encoding structure; the capacitive encoding structure comprising a capacitor electrode layer formed on top of the encapsulation layer, the encapsulation layer forming a capacitor dielectric layer between the top electrode layer and capacitor electrode layer; the capacitor electrode layer having an effective area to define a capacitance between the capacitor electrode layer and the top electrode layer of the stack of layers corresponding to an emissive area of the LED component wherein the area of the capacitor electrode determined by capacitance measurements encodes information concerning the electrical characteristics of the LED component.

2. The LED device as claimed in claim 1, wherein the capacitor electrode layer comprises a reference capacitor electrode defining a reference capacitor and a readout capacitor electrode defining a readout capacitance between the reference and readout capacitor electrodes and the top electrode layer of the stack of layers, wherein the relative areas of the reference and readout capacitor electrodes encodes information concerning the electrical characteristics of the LED component.

3. The LED device as claimed in claim 2, wherein the reference capacitor is used to calibrate the capacitance measurements using the readout capacitor electrode.

4. The LED device as claimed in claim 1, wherein the information relates to a desired driving current and/or voltage and/or a required dimming level.

5. The LED device as claimed in claim 1, wherein the capacitor electrode layer comprises a heat spreading layer.

6. The LED device as claimed in claim 1, further comprising a heat spreading layer over the capacitor electrode layer.

7. A set of LED devices as claimed in claim 1, wherein the area of the capacitor electrode layer of each of the LED devices has the same proportion to the area of the electroluminescent layer.

8. An LED lighting apparatus comprising:
   a LED device as claimed in claim 1 with a capacitive encoding structure further comprising anode and cathode terminals coupled to a power supply and an additional terminal;
   a PCB, which connects to the terminals of the LED device component; and
   a driver comprising a connection part for interfacing with the PCB, wherein the driver comprises testing circuitry coupled to the additional terminal for determining the capacitance of the capacitive encoding structure.

9. The LED lighting apparatus as claimed in claim 8, wherein the driver is adapted to drive the LED device in dependence on the encoded information concerning the characteristics of the LED component as determined by the testing circuitry.

10. The LED device as claimed in claim 5 wherein the capacitive encoding structure further comprises a heat spreading adhesive layer wherein the encapsulation layer in combination with the heat spreading adhesive layer define the capacitor dielectric layer.

11. A method of driving an LED device; the LED device comprises a substrate, a stack of layers defining an LED component, which layers include a transparent conductive layer, an electroluminescent layer, a top electrode layer, and an encapsulation layer over the top electrode layer and a capacitor encoding structure where the capacitor encoding structure comprises a capacitor electrode layer formed on top of the encapsulation layer, the encapsulation layer forming a capacitor dielectric layer between the top electrode layer and capacitor electrode layer and where the capacitor electrode layer has an effective area to define a capacitance between the capacitor electrode layer and the top electrode layer of the stack of layers corresponding to an emissive area of the LED component wherein the area of the capacitor electrode to be determined by capacitance measurements encodes information concerning the electrical characteristics of the LED component, the method comprising:

provides the LED device in an initial state, where the LED device is unpowered and the capacitor encoding structure is discharged;

coupling of a power supply to the LED device;

determining a capacitance value of the capacitance encoding structure;

converting the capacitance value into a signal proportional to the capacitance;

adjusting a current of the power supply depending on the signal proportional to the capacitance value; and feeding the adjusted current into the connected LED device.

12. The method as claimed in claim 11, wherein the capacitor electrode layer comprises a reference capacitor electrode defining a reference capacitor and a readout capacitor electrode defining a readout capacitance between the reference and readout capacitor electrodes and the top electrode layer of the stack of layers, wherein the relative areas of the reference and readout capacitor electrodes encodes information concerning the electrical characteristics of the LED component, where:

the step of determining a capacitance value comprises determining a readout capacitance value (Ca) for the readout capacitance and a reference capacitance value (Cb) from the reference capacitor;

the step of converting the capacitance value into a signal proportional to the capacitance comprises delivering a signal dependent on a ratio Ca/Cb of readout capacitance value (Ca) and a reference capacitance value (Cb); and the step of adjusting a current of the power supply comprises an adjustment depending on the signal dependent on the capacitance ratio Ca/Cb.

13. The method as claimed in claim 12, comprising measuring of the readout capacitance value (Ca) and the reference capacitance value (Cb) time-sequentially the capacitance of the first and second capacitors in sequence and deriving the capacitance ratio.

14. The method as claimed in claim 12, further comprising the step of using the reference capacitor to calibrate the capacitance measurements of the readout capacitor.

* * * * *